(12) United States Patent
Enomoto et al.

(10) Patent No.: US 12,342,666 B2
(45) Date of Patent: Jun. 24, 2025

(54) LIGHT-EMITTING DEVICE

(71) Applicant: NICHIA CORPORATION, Anan (JP)

(72) Inventors: Kiyoshi Enomoto, Komatsushima (JP); Tatsuya Kanazawa, Anan (JP)

(73) Assignee: NICHIA CORPORATION, Anan (JP)

( * ) Notice: Subject to any disclaimer, the term of this patent is extended or adjusted under 35 U.S.C. 154(b) by 608 days.

(21) Appl. No.: 17/670,269

(22) Filed: Feb. 11, 2022

(65) Prior Publication Data

US 2022/0262996 A1 Aug. 18, 2022

(30) Foreign Application Priority Data

Feb. 12, 2021 (JP) .................... 2021-020749

(51) Int. Cl.
*H10H 20/856* (2025.01)
*H10H 20/857* (2025.01)

(52) U.S. Cl.
CPC ........ *H10H 20/856* (2025.01); *H10H 20/857* (2025.01)

(58) Field of Classification Search
CPC ..... H01L 25/0753; H01L 33/60; H01L 33/58; H01L 33/62; H10H 20/8506; H10H 20/856; H10H 20/857
See application file for complete search history.

(56) References Cited

U.S. PATENT DOCUMENTS

| | | | |
|---|---|---|---|
| 2011/0043712 A1* | 2/2011 | Yamakawa | G03B 33/12 349/9 |
| 2013/0230327 A1 | 9/2013 | Shin | |
| 2015/0228868 A1* | 8/2015 | Ouderkirck | F21V 7/00 362/84 |
| 2017/0033535 A1 | 2/2017 | Joseph | |
| 2017/0180613 A1 | 6/2017 | Dobashi et al. | |
| 2017/0317467 A1 | 11/2017 | Miura et al. | |
| 2020/0083664 A1* | 3/2020 | Miura | H01S 5/02208 |
| 2020/0124953 A1 | 4/2020 | Miura | |

(Continued)

FOREIGN PATENT DOCUMENTS

| | | |
|---|---|---|
| JP | 2008-147205 A | 6/2008 |
| JP | 2013-544374 A | 12/2013 |
| JP | 2017-201684 A | 11/2017 |

(Continued)

*Primary Examiner* — Moazzam Hossain
*Assistant Examiner* — Yuchang Liang
(74) *Attorney, Agent, or Firm* — Global IP Counselors, LLP

(57) ABSTRACT

A light-emitting device includes light-emitting elements to emit first and second lights; a package having a disposition surface on which the light-emitting elements are disposed and a light extracting surface through which the first and second lights are to be emitted; a wave plate bonded to the light extracting surface of the package at a position on which a main portion of the first light is to be incident and a main portion of the second light is not to be incident; a lens member having an incidence surface on which the first light transmitted through the wave plate and the second light emitted from the light extracting surface are to be incident; and bonding parts disposed between the package and the lens member. The wave plate is disposed between the package and the lens member without being in contact with the lens member.

14 Claims, 4 Drawing Sheets

(56) References Cited

U.S. PATENT DOCUMENTS

2021/0083451 A1    3/2021  Hashimoto

FOREIGN PATENT DOCUMENTS

| | | |
|---|---|---|
| JP | 2020-014017 A | 1/2020 |
| JP | 2020-043326 A | 3/2020 |
| JP | 2020-043327 A | 3/2020 |
| JP | 2020-068084 A | 4/2020 |
| JP | 2020-530666 A | 10/2020 |
| JP | 2021-044501 A | 3/2021 |
| WO | 2016/009833 A1 | 1/2016 |
| WO | 2020/065819 A1 | 4/2020 |
| WO | 2020/066096 A1 | 4/2020 |
| WO | 2020066868 A1 | 4/2020 |

\* cited by examiner

LIGHT-EMITTING DEVICE

CROSS-REFERENCE TO RELATED APPLICATION

This application claims priority to Japanese Patent Application No. 2021-020749 filed on Feb. 12, 2021. the disclosure of which is hereby incorporated by reference in its entirety.

BACKGROUND

1. Field of the Invention

The present invention relates to a light-emitting device.

2. Description of Related Art

Japanese Unexamined Patent Application Publication No. 2020-43326 discloses a light-emitting device including a package that forms a sealed space, a plurality of semiconductor laser elements disposed in the sealed space, a lens member, and a wave plate configured to change the direction of polarization of light emitted from at least one of the semiconductor laser elements. In Japanese Unexamined Patent Application Publication No. 2020-43326, drawings illustrate a light-emitting device in which light that has passed through the lens member is incident on the wave plate.

SUMMARY

A light-emitting device in which a wave plate can be miniaturized is provided.

A light-emitting device disclosed herein includes one or more light-emitting elements configured to emit a plurality of lights including a first light and a second light; a package having a disposition surface on which the one or more light-emitting elements are disposed and a light extracting surface through which the first light and the second light are to be emitted; a wave plate bonded to the light extracting surface of the package at a position on which a main portion of the first light emitted from the light extracting surface is to be incident and a main portion of the second light is not to be incident; a lens member having an incidence surface on which the first light emitted from the light extracting surface and transmitted through the wave plate and the second light emitted from the light extracting surface are to be incident; and one or more bonding parts disposed between the package and the lens member to bond the package and the lens member together. The wave plate is disposed between the package and the lens member without being in contact with the lens member.

According to the present disclosure, a portion of lights emitted from light-emitting elements passes through a wave plate before passing through a lens member, so that the size of the wave plate can be reduced.

DETAILED DESCRIPTION

Figure 1:
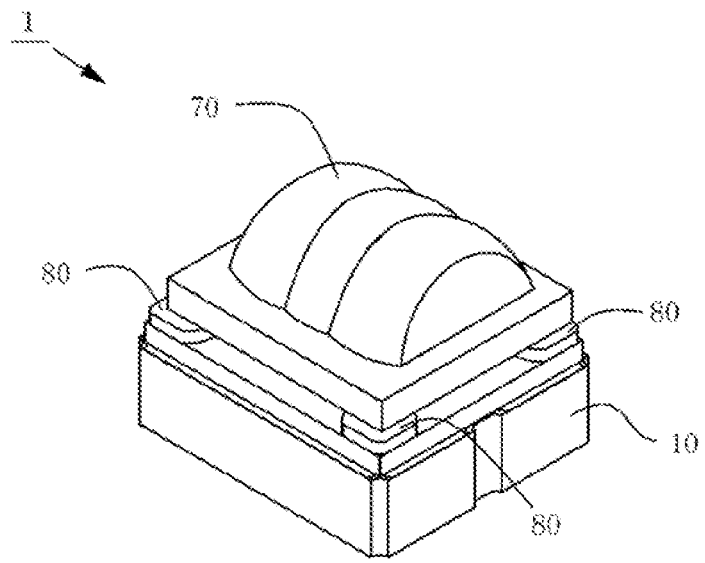
FIG. 1 is a schematic perspective view of a light-emitting device according to one embodiment.

In the present specification or the claims, as for polygonal shapes such as triangular shapes and quadrangular shapes, polygonal shapes with rounded corners, beveled corners, angled corners, reverse-rounded corners are also referred to as polygonal shapes. Not only shape with such modification at corners (end of sides9 but also shape with modifications at intermediate portion of sides of the shape are also referred to as polygons. That is, shapes that are based on polygonal shapes and partially modified are within the interpretation of the term "polygon" in the present specification and the claims.

Such interpretation is not only polygonal shapes but also applies to terms denoting specific shapes such as trapezoids, circles, protrusions, and recesses. The same applies to sides forming such shapes. That is, even if an end or an intermediate portion of a side is modified, the modified portion is interpreted as a portion of a "side." When "polygonal shapes" and "sides" without such modified portions are intended to be distinguished from those with modifications, the term "exact" is added, such as an "exact quadrangular shape."

In the present specification and the claims, expressions such as up/upper, down/lower, left, right, front, back, ahead, behind, the near side, and the far side merely indicate relationships such as relative positions, orientations, and such positional relationship does not necessarily coincide with positional relationship during use.

In the present specification, for example, terms such as "member" and "portion" or "part" may be used in the descriptions of components and the like. The term "member" may denote an object that is treated as a physically single item. The object that is treated as a physically single item may also be treated as a single component in the manufacturing. Meanwhile, the term "portion" or "part" may denote an object that does not have to be physically treated as a single item. For example, the term "portion" is used to indicate a portion of a single member.

The distinguishment between the terms "member", "portion", and "part" described above is not intended to intentionally limit the scope of the patent right in interpretation under the doctrine of equivalents. That is, even if a component is designated as a "member" in the claims, such designation does not indicate that the applicant recognizes that treatment of this component as a physically single component is essential for application of the present invention.

In the present specification or the claims, when there are a plurality of components that are to be distinguished from each other, these components may be described using terms "first" and "second" may be used at the top of the name of the components. Also, there may be a case in which objects to be distinguished differ between the present specification and the claims. Therefore, even if a component described in the claims is indicated by the same term as in the present specification, the object specified by the component may differ between the present specification and the claims.

For example, when there are components distinguished from each other by using the terms "first," "second," and "third" in the present specification and the "first" and "third" components of these components in the present specification are to be described in the claims, corresponding components may be described using the terms "first" and "second" for clarity. In this case, the "first" and "second" components in the claims indicate the "first" and "third" components in the present specification. This rationally and flexibly applies not only to components but also to other objects.

An embodiment of the present invention will be described below. Further, certain embodiments of the present invention will be specifically described referring to the drawings. The embodiment of the present invention is not limited to this specific embodiment. That is, the embodiment shown in the drawings is not the only embodiment of the present invention. Sizes or positional relationships of members illustrated in each drawing may be exaggerated in order to facilitate understanding.

Embodiment

A light-emitting device 1 according to one embodiment is described.

FIG. 1 to FIG. 8 schematically show an illustrative embodiment of the light-emitting device 1. FIG. 1 is a schematic perspective view of the light-emitting device 1.

Figure 2:
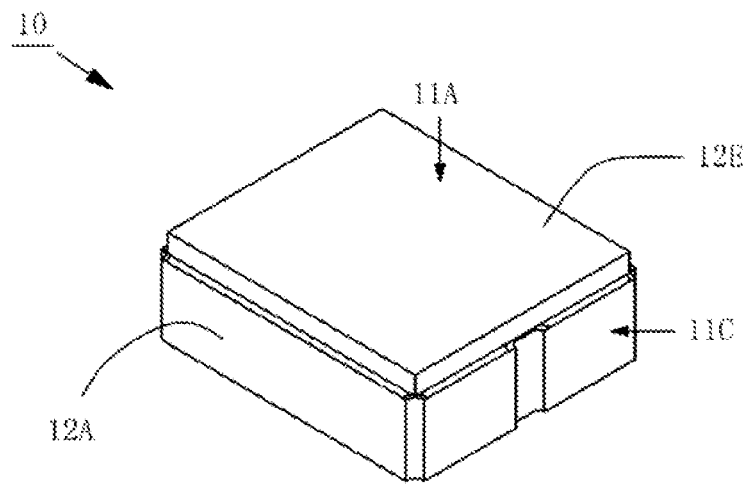
FIG. 2 is a schematic perspective view of a package according to one embodiment.

FIG. 2 is a schematic perspective view of a package 10 in the light-emitting device 1.

Figure 3:
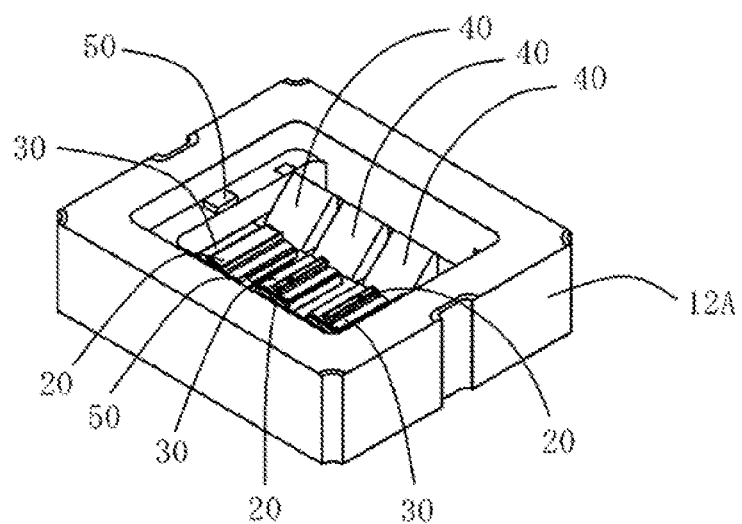
FIG. 3 is a schematic perspective view of the package according to one embodiment without a cover.
Figure 4:
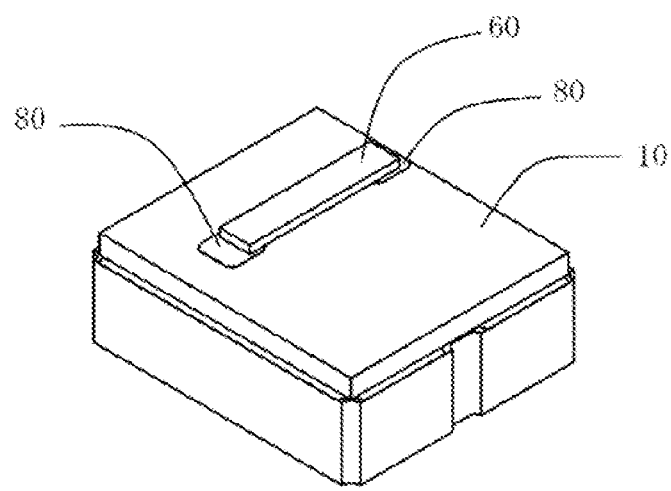
FIG. 4 is a schematic perspective view of the package according to one embodiment provided with a wave plate.

FIG. 3 is a schematic perspective view of the package 10 without a cover 12E. FIG. 4 is a schematic perspective view of the package 10 provided with a wave plate 60.

Figure 5:
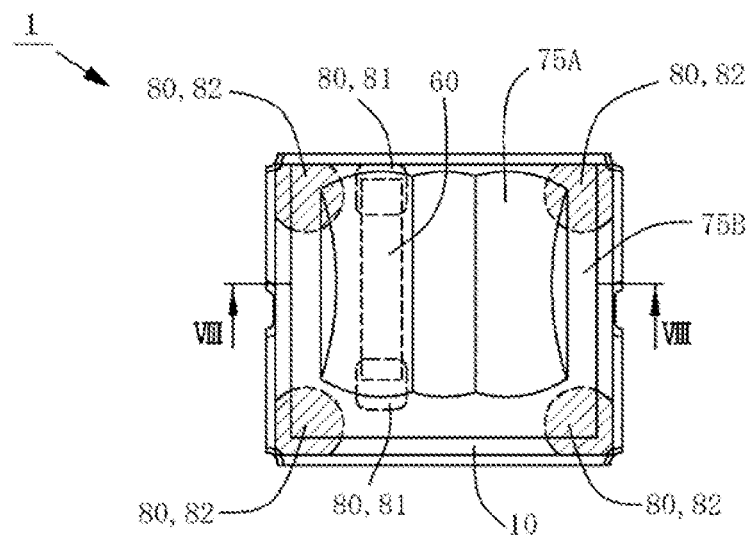
FIG. 5 is a schematic top view of the light-emitting device according to one embodiment.
Figure 6:
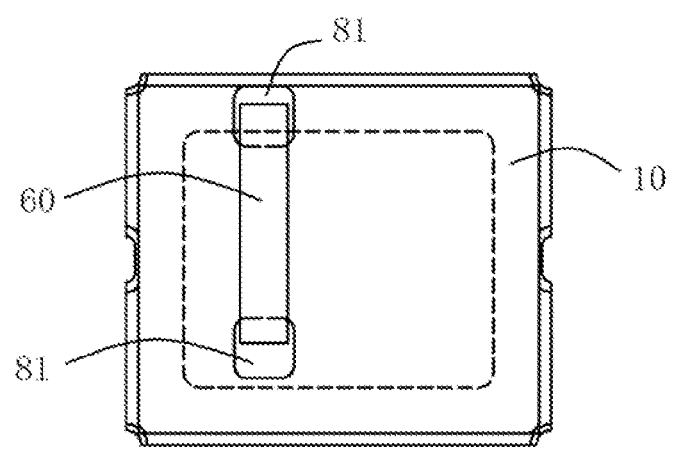
FIG. 6 is a schematic top view of the light-emitting device without a lens member according to one embodiment.
Figure 7:
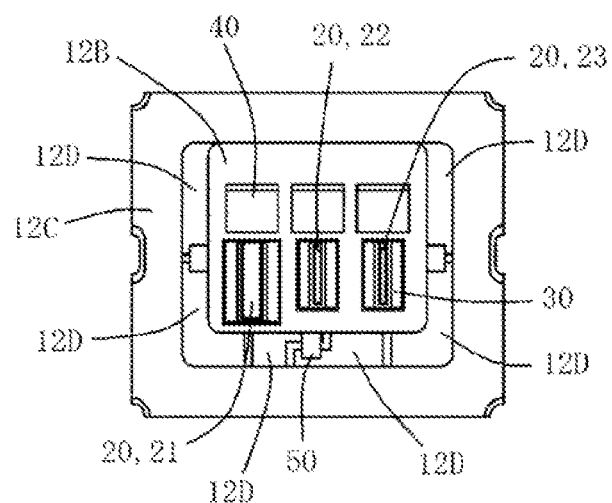
FIG. 7 is a schematic top view of the package according to one embodiment without the cover.
Figure 8:
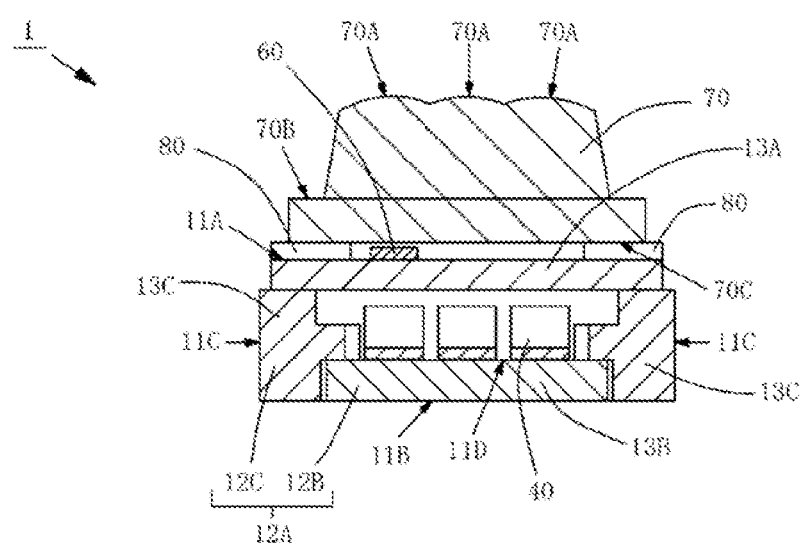
FIG. 8 is a schematic cross-sectional view of the light-emitting device taken along the line VIII-VIII of FIG. 5.

FIG. 5 is a schematic top view of the light-emitting device 1. FIG. 6 is a schematic top view of the light-emitting device 1 without a lens member 70. FIG. 7 is a schematic top view of substantially the same state as the state shown in FIG. 3. FIG. 8 is a schematic cross-sectional view taken along the line VIII-VIII of FIG. 5.

The hatched regions in FIG. 5 indicate second bonding parts 82. Further, the broken lines indicate the wave plate 60 and portions of first bonding parts 81 overlapping with the lens member. The broken line in FIG. 6 indicates the outer periphery of the interior space of the package 10.

The light-emitting device 1 includes a plurality of components. The components include the package 10, one or more light-emitting elements 20, one or more submounts 30, one or more reflective members 40, a protective element 50, the wave plate 60, the lens member 70, and bonding portion 80.

The light-emitting device 1 may include other components. For example, the light-emitting device 1 may further include light-emitting elements such as a light-emitting diode and a semiconductor laser element. The light-emitting device 1 does not necessarily include all of the components described above.

Components of the light-emitting device 1 will be described below.

Package 10

The package 10 has an upper surface 11A, a lower surface 11B, and one or more outer lateral surfaces 11C. The package 10 has a rectangular parallelepiped shape. The upper surface 11A, the lower surface 11B, and the one or more outer lateral surfaces 11C each constitutes a portion of the rectangular parallelepiped external shape. In a top view, the package 10 has a rectangular external shape in which one pair of opposite sides are longer than the other pair of opposite sides. That is, the package 10 has a rectangular external shape with the one pair of opposite sides being the long sides and the other pair of opposite sides being short sides. The package 10 does not necessarily have a rectangular parallelepiped shape.

The package 10 has a space inside. The interior space is sealed, and substantially no gas comes in and out of the space. The interior space may be hermetically sealed.

The package 10 has an upper portion 13A, a lower portion 13B, and a lateral portion 13C with respect to the interior space of the package 10. The upper surface 11A, the lower surface 11B, and the one or more outer lateral surfaces 11C are respectively included in the upper portion 13A, the lower portion 13B, and the lateral portion 13C. The upper portion 13A, the lower portion 13B, and the lateral portion 13C may be referred to as direction portions. That is, all of the upper portion 13A, the lower portion 13B, and the lateral portion 13C can be considered as direction portions. The direction portions are portions of the package 10 located in specific directions such as upper, lower, left, and right directions with respect to the interior space.

The interior space of the package 10 is defined by a plurality of surfaces. The surfaces defining the interior space include a lower surface of the upper portion 13A, an upper surface of the lower portion 13B, and one or more inner lateral surfaces of the lateral portion 13C. The surfaces defining the interior space also include a disposition surface 11D on which other components are disposed. For example, the upper surface of the lower portion 13B can serve as the disposition surface 11D. Another surface may serve as the disposition surface 11D.

The package 10 includes a light-transmissive portion. The light-transmissive portion is a portion having a high transmissivity. The expression "having high transmissivity" as used herein refers to having a transmittance of 80% or greater of light, but does not necessarily indicate having transmittance of 80% or greater with respect to all wavelengths. Any direction portion among the upper portion 13A, the lower portion 13B, and the lateral portion 13C may he a light-transmissive portion.

The package 10 includes a light-shielding portion. The light-shielding portion is a portion having high light-shielding performance. The expression "having high light-shielding performance" in the present specification indicates that the transmissivity to light is 10% or less. A direction portion that is not a light-transmissive portion may be a light-shielding portion.

The direction portion of the package 10 having the disposition surface 11D is a light-shielding portion. The direction portion of the package 10 having the surface facing the disposition surface 11D is a light-transmissive portion. For example, the lower portion 13B of the package 10 is a light-shielding portion, and the upper portion 13A of the package 10 is a light-transmissive portion.

The package 10 includes a base member 12A and the cover 12E. The package 10 having the interior space is formed by bonding the cover 12E to the base member 12A. One or more surfaces of the base member 12A defining the interior space partially or entirely has high light-shielding performance. One or more surfaces of the cover 12E defining the interior space partially or entirely have a high transmissivity.

The base member 12A includes the lower portion 13B. The base member 12A further includes the lateral portion 13C. The cover 12E includes the upper portion 13A. The cover 12E may include the lateral portion 13C. The base member 12A has a rectangular external shape in a top view. The disposition surface 11D has a rectangular external shape in a top view. Each of the base member 12A and the disposition surface 11D does not necessarily have a rectangular external shape.

The package 10 can be constituted of a base member 12A having a recessed shape and a cover 12E having a flat plate shape. The recess of the base member 12A is closed with the cover 12E. The base member 12A and the cover 12E may have other shapes, For example, the package 10 can be constituted of a base member 12A having a flat plate shape and a cover 12E having a cap-like shape.

The base member 12A can be formed by bonding a heat dissipation member 12B constituting a heat dissipation portion to a wiring member 12C constituting a wiring portion. The heat dissipation member 12B includes the lower portion 13B of the base member 12A, and the wiring member 12C includes the lateral portion 13C of the base member 12A. The base member 12A can be constituted of a heat dissipation member 12B having a flat plate shape and a wiring member 12C having a frame shape.

A surface of the wiring member 12C has a plurality of wiring regions 12D. A current path is formed through the wiring member 12C to electrically connect two wiring regions. The wiring regions 12D can be electrically connected to a wiring region other than the wiring regions 12D. A current path is not formed through the heat dissipation member 12B. The heat dissipation member 12B is surrounded by the wiring member 12C in a top view and a bottom view.

The heat dissipation member 12B can be formed using metal as a main material. The term "main material" as used herein refers to a material whose content is the highest in a member in terms of weight or volume. When the member is formed of a single material, that material is the main material. That is, the expression that a material is the main material includes a case in which the material can be contained at a content of 100%. Examples of the main material include metals such as copper, aluminum, and iron and composites such as copper-molybdenum, a copper-diamond composite material, and copper-tungsten.

For the wiring member 12C, a ceramic can be used as a main material. The wiring regions 12D can be formed by forming films of metal. Examples of the ceramic employed as the main material of the wiring member 12C include aluminum nitride, silicon nitride, aluminum oxide, and silicon carbide.

The base member 12A may consist of the wiring member 12C. For example, the whole base member 12A shown in the drawings may be formed of the wiring member 12C containing ceramic as the main material.

The cover 12E is formed using glass as a main material. The main material of the cover 12E has a high transmissivity. The main material of the cover 12E is not limited to glass but may be, for example, sapphire.

Light-Emitting Element 20

The light-emitting element 20 has a light emission surface from which light is emitted. The light-emitting element 20 emits light from one or more emission points on the light emission surface. Examples of the light-emitting element 20 include a semiconductor laser element. A light-emitting element other than a semiconductor laser element may be used for the light-emitting element 20. For example, a light-emitting element configured to emit p-polarized light from the light emission surface or a light-emitting element configured to emit s-polarized light from the light emission surface can be employed for the light-emitting element 20.

For example, a light-emitting element configured to emit blue light, a light-emitting element configured to emit green light, or a light-emitting element configured to emit red light can be employed for the light-emitting element 20. A light-emitting element that emits light having another color may be employed for the light-emitting element 20.

The term "blue light" as used herein refers to light with a peak emission wavelength within the range of 420 nm to 494 nm. The term "green light" as used herein refers to light with a peak emission wavelength within the range of 495 nm to 570 nm. The term "red light" as used herein refers to light with a peak emission wavelength within the range of 605 nm to 750 nm.

The semiconductor laser element that can be employed for the light-emitting element 20 will he described. The semiconductor laser element has a rectangular external shape with the one pair of opposite sides being the long sides and the other pair of opposite sides being short sides in a top view. The semiconductor laser element is formed of a plurality of semiconductor layers including an active layer and layered in a direction from the lower surface to the upper surface. A lateral surface of the semiconductor laser element that corresponds to one of the two short sides of the rectangle serves as an emission end surface from which light is emitted. The emission end surface of the semiconductor laser element can be regarded as the light emission surface of the light-emitting element 20. Each of the upper surface and the lower surface of the semiconductor laser element has a larger area than the emission end surface.

Light (laser light) emitted from the semiconductor laser element has divergence. Diverging light is emitted from the light emission surface of the semiconductor laser element. Light emitted from the semiconductor laser element forms an elliptic far-field pattern (hereinafter referred to as "FFP") in a plane parallel to the emission end surface of the semiconductor laser element. The FFP is the shape or the light intensity distribution of the emitted light at a position away from the emission end surface.

In the present specification, a light passing through the center of the elliptic FFP, in other words, a light with the peak intensity in the light intensity distribution of the FFP, will be referred to as a "light traveling on the optical axis" or a "light passing through the optical axis". Also, a light having an intensity of $1/e^2$ or more of the peak intensity in the light intensity distribution of the FFP will be referred to as a "main portion of light".

The FFP of light emitted from the semiconductor laser element has an elliptic shape that is longer in a direction of layering the semiconductor layers in the semiconductor laser element than in a direction perpendicular to the direction of layering the semiconductor layers. The direction perpendicular to the direction of layering the semiconductor layers can be referred to as a surface direction of the semiconductor layers including the active layer. The major axis direction of the elliptic FFP is referred to as a "fast axis direction of the semiconductor laser element", and the minor axis direction is referred to as a "slow axis direction of the semiconductor laser element".

The angle at which light with a light intensity of $1/e^2$ of the peak light intensity diverges on the basis of the light intensity distribution of the FFP of light emitted from the semiconductor laser element will be referred to as an "angle of divergence of light from the semiconductor laser element". For example, the angle of divergence of light may be determined from a light intensity of a half of light intensity of the peak light intensity instead of the light intensity of $1/e^2$ of the peak light intensity. In the descriptions in the present specification, the term "angle of divergence of light" when used singly refers to an angle of divergence of light at a light intensity of $1/e^2$ of the peak light intensity.

Examples of a semiconductor laser element configured to emit blue light or a semiconductor laser element configured to emit green light include a semiconductor laser element including a nitride semiconductor. Examples of the nitride semiconductor include GaN, InGaN, and AlGaN. Examples of a semiconductor laser element configured to red light include an element including an InAlGaP, GaInP, GaAs, or AlGaAs semiconductor.

Submount 30

The submount 30 has two bonding surfaces and has a rectangular parallelepiped shape. The submount 30 has a rectangular external shape in which one pair of opposite sides are longer than the other pair of opposite sides in a top view. A surface opposite to one bonding surface is the other bonding surface. The distance between the two bonding surfaces is smaller than the distance between other two surfaces opposite to each other. The submount 30 may have a shape other than a rectangular parallelepiped shape. For the submount 30, for example, silicon nitride, aluminum nitride, or silicon carbide can be used.

Reflective Member 40

The reflective member 40 has a light-reflective surface that reflects light. The light-reflective surface is inclined with respect to the lower surface of the reflective member 40. The light-reflective surface is not perpendicular or parallel to the lower surface of the reflective member 40. A straight line connecting the lower and upper ends of the light-reflective surface is inclined with respect to the lower surface of the reflective member 40. The angle of the light-reflective surface with respect to the lower surface of the reflective member 40 or the angle of the straight line connecting the lower and upper ends of the light-reflective surface with respect to the lower surface of the reflective member 40 will be referred to as an "inclination angle of the light-reflective surface".

In the reflective member 40 shown in the drawings, the light-reflective surface is flat and forms an inclination angle of 45° with the lower surface of the reflective member 40. The light-reflective surface is not necessarily a flat surface but may be, for example, a curved surface. The inclination angle of the light-reflective surface is not necessarily 45°.

The reflective member 40 has a rectangular external shape in a top view, The light-reflective surface has a rectangular external shape in a top view. The light-reflective surface covers an area of 70% or greater of the area of the reflective member 40 in a top view.

As a main material of the reflective member 40, glass, metal, or the like can be used. The main material is preferably a heat-resistant material, for example, quartz, glass such BK7 (borosilicate glass), or metal such as aluminum. As the main material of the reflective member 40, Si can be used. When the main material is a reflective material, the main material can constitute the light-reflective surface. When forming the light-reflective surface using a material other than the main material, for example, the light-reflective surface can be formed by forming a film of a metal such as Ag and Al or a dielectric multilayer film such as $Ta_2O_5/SiO_2$, $TiO_2/SiO_2$, and $Nb_2O_5/SiO_2$.

The light-reflective surface has a reflectance of 90% or more with respect to a peak wavelength of light incident on the light-reflective surface. The reflectance may be 95% or more. The reflectance herein is 100% or less or less than 100%.

Protective Element 50

The protective element 50 prevents excessive current from flowing through and thus breaking a specific element (such as the light-emitting element 20). Examples of the protective element 50 include a Zener diode. For such a Zener diode, a Zener diode formed of Si can be employed.

Wave Plate 60

The wave plate 60 is configured to cause light to be emitted with the state of polarization different from that of the light when incident. Examples of the wave plate 60 include a half-wave plate configured to rotate the direction of polarization of linearly polarized light and a quarter-wave plate configured to convert linearly polarized light into circularly polarized light. For example, a half-wave plate can be employed for the wave plate 60.

The wave plate 60 has a flat plate shape. The wave plate 60 is rectang in a top view. The wave plate 60 may have an appropriate shape other than a rectangular shape, for example, a shape elongated in one direction such as an elliptic shape. In the present specification, a direction along the long axis of the shape of the wave plate 60 in a top view will be referred to as the longitudinal direction of the wave plate 60, and a direction perpendicular to the longitudinal direction in a top view will he referred to as the lateral direction of the wave plate 60. That is, in an example of a rectangular shape, the direction along the long side is the longitudinal direction. and the direction along the short side is the lateral direction.

The wave plate 60 has a thickness of 100 wn or greater and 400 μm or less. The term "thickness" as used in the present specification refers to a thickness in the upper-lower direction (the thickness direction extending between the package 10 and the lens member 70). The maximum length of the wave plate 60 in the longitudinal direction and the maximum length in the lateral direction are both greater than the thickness of the wave plate 60.

Lens Member 70

The lens member 70 has an upper surface 70B, a lower surface 70C, a lateral surface, and one or more lens surfaces 70A. The one or more lens surfaces 70A are located on the upper surface 70B side. The one or more lens surfaces 70A may be located on the lower surface 70C side. The upper surface 70B and the lower surface 70C are flat. The one or more lens surfaces 70A meet the upper surface 70B. The one or more lens surfaces 70A are surrounded by the upper surface 70B in a top view. The lens member 70 has a rectangular external shape in a top view. The lower surface of the lens member 70 has a rectangular shape.

In the lens member 70, the one or more lens surfaces 70A and a portion directly below the one or more lens surfaces 70A in a top view will be referred to as a "lens portion 75A". In the lens member 70, the upper surface 70B and a portion directly below the upper surface 70B in a top view will be referred to as a non-lens portion 75B. With respect to a plane including the upper surface 70B, a portion of the lens portion 75A on the lens surface 70A side will be referred to as a "lens-shaped portion", and the other portion of the lens portion 75A on the lower surface 70C side will be referred to as a "flat plate portion". The lower surface of the lens portion 75A is a portion of the lower surface 70C of the lens member 70. The lower surface 70C of the lens member 70 is constituted of the lower surface of the lens portion 75A and the lower surface of the non-lens portion 75B.

The lens member 70 shown in the drawings has a plurality of lens surfaces 70A. The lens surfaces 70A are connected in a single direction. The lens member 70 has three lens surfaces 70A that have vertices aligned in a straight line.

The direction of alignment of the lens surfaces 70A in a top view will be referred to as a "connection direction". The lens surfaces 70A are longer in the connection direction than in a direction perpendicular to the connection direction in a top view. The lens surfaces 70A may be shorter in the connection direction than in the direction perpendicular to the connection direction in a top view. In the lens member 70 shown in the drawings, the case in which the plurality of lens surfaces 70A are constituted of three lens surfaces 70A corresponds to the size relationship that the lens surfaces 70A are longer in the connection direction than in the direction perpendicular to the connection direction in a top view. When the plurality of lens surfaces 70A are constituted of two lens surfaces 70A, such lens surfaces 70A corresponds to the size relationship that the lens surfaces 70A is shorter in the connection direction than in the direction perpendicular to the connection direction in a top view.

The lens member 70 has a high transmissivity. The lens portion 75A and the non-lens portion 75B of the lens member 70 both have high transmissivities. The lens member 70 has a high transmissivity as a whole. For example, the lens member 70 can be formed of glass such as BK7.

Bonding Part 80

The bonding parts 80 are hardened articles of an adhesive after performing bonding. For example, an adhesive containing resin is used for the adhesive for the bonding parts 80. Examples of such an adhesive include UV-curable resins and thermosetting resins. The adhesive may be applied to a plurality of locations. Accordingly, a plurality of bonding parts 80 can be formed by bonding treatment. The adhesive used for the bonding treatment is not necessarily of a single type. For example, a plurality of types of adhesives are applied to different positions, Light-Emitting Device 1

Subsequently, the light-emitting device 1 including the components described above will be described.

A plurality of light-emitting elements 20 including a first light-emitting element 21 configured to emit a first light and a second light-emitting element 22 configured to emit a second light can constitute the one or more light-emitting elements 20 included in the light-emitting device 1. A plurality of light-emitting elements 20 further including a third light-emitting element 23 configured to emit a third light can constitute the one or more light-emitting elements 20.

The one or more light-emitting elements 20 are disposed in the interior space of the package 10. The one or more light-emitting elements 20 are disposed on the disposition surfiice 11D. When the light-emitting elements 20 are disposed in the hermetically sealed interior space, deterioration in the quality of the light-emitting elements 20 due to attraction of dust can be reduced.

Each of the one or more light-emitting elements 20 is disposed with the light emission surface facing in a lateral direction. Each of the one or more light-emitting elements 20 is disposed the light emission surface facing one of inner lateral surfiices of the package 10. The inner lateral surface facing the light emission surface of the light-emitting element 20 will be hereinafter referred to as an "inner lateral surface on the light emission side". Each of the one or more light-emitting elements 20 is disposed with the light emission surface facing a portion of the lateral portion 13C corresponding to a long side of the package 10.

The light emission surface faces a portion of the lateral portion 13C corresponding to one of the pair of long sides of the package 10, and the surface opposite to the light emission surface faces a portion of the lateral portion 13C corresponding to the other long side. Two lateral surfaces of each light-emitting element 20 meeting the light emission surface face respective portions of the lateral portion 13C corresponding to the pair of short sides of the package 10.

The one or more light-emitting elements 20 include one or more light-emitting elements 20 each having the light emission surface parallel to the long sides of the package 10 in a top view. The one or more light-emitting elements 20 include one or more light-emitting elements 20 each having the light emission surface perpendicular to the disposition surface 11D. The one or more light-emitting elements 20 include one or more light-emitting elements 20 each having the light emission surface parallel to the long sides of the package 10 in atop view and having the light emission surface perpendicular to the disposition surface 11D.

A plurality of light-emitting elements 20 are aligned such that the light emission surfaces face in the same direction. The term "same direction" as used herein includes the case in which the light emission surfaces of adjacent light-emitting elements 20 are oriented with rotational deviation within the range of +10' in a planar direction parallel to the disposition surface 11D in a top view. The light-emitting elements 20 are aligned in the longitudinal direction or the long side direction of the package 10 in a top view, Adjacent light-emitting elements 20 are disposed with a distance of 0.2 mm or more and 2 mm or less therebetween.

The maximum length of each of the one or more light-emitting elements 20 in the long side direction is 30% or greater and 70% or less of the length of the disposition surfiice 11D in a direction parallel to the long side direction in a top view. Having such a length can contribute to miniaturization of the package 10.

A light-emitting element 20 located at one of both ends of an array of the light-emitting elements 20 is disposed in one of two half portions of the disposition surface 11D with respect to a straight line perpendicular to the light emission surface, and a light-emitting element 20 located at the other end is disposed in the other of the two half portions of the disposition surface 11D. A single light-emitting element 20 is disposed in each of equal regions of the disposition surface 11D defined by division with straight lines perpendicular to the light emission surfaces into the number of the light-emitting elements 20 in the array. With such an arrangement, a plurality of light-emitting elements 20 can be efficiently disposed on the disposition surface 11D.

The light emission surfaces of the light-emitting elements 20 can be in a single plane. That is, the light-emitting elements 20 are disposed with the light emission surfaces being aligned. A straight line that is parallel to the light emission surfaces and divides the package 10 into two equal areas in a top view passes through the light-emitting elements 20 in a top view.

A plurality of lights are emitted from the one or more light-emitting elements 20. In other words, the one or more light-emitting elements 20 emit a plurality of lights. The lights are emitted from the one or more light emission surfaces of the one or more light-emitting elements 20. The lights travel in a lateral direction from the one or more light emission surfaces. The lights are emitted from different emission points. The lights can include a red light, a green light, and a blue light.

The optical axes of the lights emitted from the one or more light emission surfaces are parallel to each other. A light with a FFP in which a direction perpendicular to the disposition surface 11D is the fast axis direction is emitted in a lateral direction from each light emission surface. Each light-emitting element 20 has an angle of divergence of 20° or less in the slow axis direction. The angle of divergence is greater than 0°.

The lights include two lights with different directions of polarization. The lights include a p-polarized light and an s-polarized light. One of the p-polarized light and the s-polarized light is emitted from the light emission surface of the first light-emitting element 21, and the light with the other direction of polarization is emitted from the light emission surface of the second light-emitting element 22. The lights include two lights with different peak emission wavelengths. The lights include two lights having different emission colors with different directions of polarization. The lights include at least a blue or red light.

Among the plurality of light-emitting elements 20, a light-emitting element 20 with the largest decrease in the amount of light due to a rise in temperature is disposed at an end of the array of the plurality of light-emitting elements 20. A light-emitting element 20 with the second largest decrease in the amount of light due to a rise in temperature is disposed at the other end of the array of the plurality of light-emitting elements 20. With this arrangement, the heat dissipation performance for the light-emitting elements 20 with larger decreases in the amount of light due to a rise in temperature can be improved compared with the case in which two light-emitting elements 20 are arranged on both sides of light-emitting elements 20 with larger decreases in the amount of light due to a rise in temperature than that of the two light-emitting elements 20.

The light-emitting device 1 shown in the drawings is an example of a light-emitting device 1 including three light-emitting elements 20 as the one or more light-emitting elements 20. Each of the light-emitting elements 20 is a semiconductor laser element. The three light-emitting elements 20 are constituted of the first light-emitting element 21 configured to emit red light, the second light-emitting element 22 configured to emit green light, and the third light-emitting element 23 configured to emit blue light. The second light-emitting element 22 is arranged between the first light-emitting element 21 and the third light-emitting element 23. The first light-emitting element 21 is configured to emit s-polarized light from the light emission surface, and the second light-emitting element 22 and the third light-emitting element 23 are configured to emit p-polarized light from the light emission surfaces. The first light-emitting element 21 corresponds to the light-emitting element 20 with the poorest temperature characteristic of the amount of light (i.e., the first light-emitting element 21 has the largest decrease in the amount of light due to a rise in temperature among the first light-emitting element 21, the second light-emitting element 22, and the third light-emitting element 23).

The one or more light-emitting elements 20 are bonded to the one or more submounts 30. One of bonding surfaces of the submount 30 is bonded to the light-emitting element 20, and the other of the bonding surfaces is bonded to the disposition surface 11D. The light-emitting element 20 can be disposed on the disposition surface 11D with the submount 30 disposed therebetween as described above.

A single submount 30 is provided for a single light-emitting element 20. That is, the number of the submounts 30 disposed is equal to the number of the light-emitting elements 20. A plurality of light-emitting elements 20 be disposed on a single submount 30.

The submounts 30 include two or more submounts 30 having different sizes in a top view. The first light-emitting element 21 is bonded to the submount 30 with the larger area of the two submounts 30 having different sizes. This structure allows for improving the heat dissipation performance for the first light-emitting element 21.

The one or more reflective members 40 are disposed in the interior space of the package 10. The one or more reflective members 40 are disposed on the disposition surface 11D. The one or more reflective members 40 have one or more light-reflective surfaces. A plurality of lights arc reflected at the one or more light-reflective surfaces. The light-reflective surface is inclined at an angle of 45° with respect to the direction of travel of a light passing through the optical axis. A plurality of reflected lights travel upward from the one or more light-reflective surfaces. The one or more light-reflective surfaces are irradiated with main portions of the lights.

A single reflective member 40 is provided for a single light-emitting element 20. That is, the number of the reflective members 40 disposed is equal to the number of the light-emitting elements 20. The reflective members 40 have the same size and shape. The light-reflective surface of a single reflective member 40 is irradiated with the main portion of a light emitted from a single light-emitting element 20. The light-reflective surface of a single reflective member 40 may be irradiated with the main portions of lights emitted from a plurality of light-emitting elements 20.

In atop view, the reflective member 40 has a length in a direction parallel to the long sides of a corresponding light-emitting element 20 is 15% or greater and 40% or less of the length of the disposition surface 11D in a direction parallel to the long side direction, Having such a length can contribute to miniaturization of the package 10.

The sum of the maximum length of one of the one or more light-emitting elements 20 in the long side direction and the length of the reflective member corresponding to the light-emitting element 20 with the maximum length in a direction parallel to the long side direction is 65% or greater and 95% or less of the length of the disposition surface 11D in a direction parallel to the long side direction in a top view. Having such lengths can contribute to miniaturization of the package 10.

The light-reflective surface of the reflective member 40 reflects 90% or greater of the main portion of an incident light. The light-emitting device 1 does not necessarily include the reflective member 40. When not including the reflective member 40, for example, the emission end surface of the light-emitting element 20 faces upward.

A plurality of reflective members 40 are aligned in the long side direction of the package 10 in a top view. Irradiation points at which lights passing through a plurality of optical axes are irradiated on the light-reflective surflices are aligned in a single straight line in a top view. The straight line is parallel to the long side direction of the package 10.

The optical axes of the lights reflected by the one or more light-reflective surfaces are parallel to each other.

In the example of the light-emitting device 1 shown in the drawings, the submount 30 bonded to the first light-emitting element 21 has a length greater than that of the reflective member 40 corresponding to the first light-emitting element 21 in a direction parallel to the light emission surface in a top view. The submount 30 bonded to the second light-emitting element 22 or the third light-emitting element 23 has a length smaller than the reflective member 40 corresponding to the second light-emitting element 22 or the third light-emitting element 23 in the direction parallel to the light emission surface. The three reflective members have the same length in the direction parallel to the light emission surface. Having such lengths allows miniaturization of the light-emitting device 1 with consideration for the heat dissipation performance.

One or more protective elements 50 are disposed in the interior space of the package 10. The one or more protective elements 50 are disposed on the wiring member 12C. The one or more protective elements 50 are electrically connected to the wiring regions 12D.

A single protective element 50 is provided for a single light-emitting element 20. The protective elements 50 are disposed to protect respective corresponding light-emitting elements 20. The one or more protective elements 50 are disposed outside the respective corresponding light-emitting elements 20 in a top view.

In the example of the light-emitting device 1 shown in the drawings, a plurality of protective elements 50 are disposed. Two protective elements 50 corresponding to the first light emitting element 21 and the third light-emitting element 23 are disposed on portions of the lateral portion 13C corresponding to the pair of short sides of the package 10. A protective element 50 corresponding to the second light-emitting element 22 is disposed on a portion of the lateral portion 13C corresponding to a long side of the package 10 and opposite to the light emission side. In this arrangement, the protective elements 50 can he disposed near the respective corresponding light-emitting elements 20.

A plurality of lights pass through the light-transmissive portion and are emitted to the outside of the package 10. A plurality of lights reflected at the one or more reflective members 40 are emitted from a light extracting surface. 90% or greater of the main portions of light emitted from each of the light-emitting elements 20 is emitted to the outside through the light extracting surface of the package 10. The lights emitted to the outside of the package 10 include two lights with different directions of polarization on the light extracting surface of the package 10. The main portions of lights do not overlap with each other on the light extracting surface of the package 10 through which the lights are emitted.

In the light-emitting device 1 shown in the drawings, a plurality of lights pass through the upper portion 13A of the package 10 and are emitted to the outside of the package 10. That is, the upper surface of the upper portion 13A serves as the light extracting surface of the package 10. On the light extracting surface of the package 10 through which the lights are emitted, the lights have the same slow axis direction and the same fast axis direction. The slow axis direction on the light extracting surface of the package 10 coincides with the long side direction of the package 10. Points on the light extracting surface of the package 10 through which lights passing through a plurality of optical axes pass are aligned in a single straight line in a top view. The straight line is parallel to the long side direction of the package 10. On the light extracting surface of the package 10, the directions of polarization of the first light and the second light differ from each other. On the light extracting surface of the package 10, the directions of polarization of the second light and the third light are the same.

The expression "the directions of polarization of light are the same" indicates that the directions of polarization of light substantially coincide with each other. The expression "the directions of polarization of light differ from each other" indicates that the directions of polarization of light differ from each other to the extent that the directions of polarization of light cannot be considered as substantially coinciding with each other. For example, in the light-emitting device 1 shown in the drawings, a relative difference in angles of the directions of polarization of light between the second light and the third light is 10° or less, which indicates the state in which the directions of polarization of light substantially coincide with each other.

The wave plate 60 is disposed on the light extracting surface of the package 10. The wave plate 60 is bonded to the light extracting surface of the package 10. The wave plate 60 is disposed such that the thickness direction of the wave plate 60 is perpendicular to the light extracting surface of the package 10. The wave plate 60 is bonded to the upper surface of the cover 12E. The wave plate 60 is bonded to the package 10 with an adhesive. By this bonding, the bonding parts 80 are formed in contact with the wave plate 60 and the package 10.

Light emitted from the light extracting surface of the package 10 is incident on a surface of the wave plate 60 facing the light extracting surface of the package 10. The light incident on the incidence surface of the wave plate 60 is emitted from an emission surface opposite to the incidence surfſice. The main portion of at least one light does not enter the wave plate 60. The wave plate 60 is disposed at a position on which the main portion of the first light emitted from the light extracting surface of the package 10 is incident but the main portion of the second light is not incident. Light passing through the wave plate 60 is emitted from the wave plate 60 with the same direction of polarization as that of light emitted from the light extracting surface of the package 10 without passing through the wave plate 60.

The wave plate 60 is disposed such that the main portions of one or more lights pass through the wave plate 60. The wave plate 60 is disposed such that the main portion of a light having a single color passes through the wave plate 60. The wave plate 60 corresponds to one or more predetermined light-emitting elements 20 among the one or more light-emitting elements 20. The one or more predetermined light-emitting elements 20 are constituted of half or less the number of the light-emitting elements 20 included in the light-emitting device 1.

The wave plate 60 is disposed at a position through which a virtual line passing through the midpoints of the long sides of the package 10 in a top view and being parallel to the short side direction does not pass. The wave plate 60 corresponds to a light-emitting element 20 disposed at an end of the array of the light-emitting elements 20. This allows for changing the direction of polarization of light from the light-emitting element 20 that is disposed at the end of the array of the light-emitting elements 20 in consideration of the heat dissipation performance. The wave plate 60 is disposed such that the main portion of a light emitted from a single light-emitting element 20 passes through the wave plate 60.

In a plan view parallel to the light extracting surface of the package 10, the wave plate 60 is disposed at a position overlapping with the light-emitting element 20, which is configured to emit the main portion of light to pass through the wave plate 60. The wave plate 60 is disposed with the longitudinal direction aligned with the major axis direction of the FFP of light incident on the wave plate 60.

When two light-emitting elements 20 configured to emit lights with different directions of polarization are arranged adjacent to each other, the main portion of light emitted from one of the light emitting elements enters the wave plate 60 while the main portion of the light emitted from the other light-emitting element 20 does not enter the wave plate 60. The wave plate 60 is disposed at a position overlapping with one of a plurality of light-emitting elements 20 in a plan view parallel to the light extracting surface of the package 10.

The wave plate 60 is disposed at a position overlapping with the reflective member 40 that reflects the main portion of light to pass through the wave plate 60 in a plan view parallel to the light extracting surface of the package 10. The wave plate 60 is disposed at a position overlapping with one of a plurality of reflective members 40 in a plan view parallel to the light extracting surface of the package 10.

One of both ends of the wave plate 60 in the longitudinal direction can overlap with the lateral portion 13C of the package 10, while the other end of the wave plate 60 in the longitudinal direction does not overlap with the lateral portion 13C in a top view. The midpoint between both ends of the wave plate 60 in the longitudinal direction can overlap with the reflective member 40 in a top view. When the wave plate 60 has at least one of such shapes, the size of the wave plate 60 can be reduced.

The bonding part 80 bonding the wave plate 60 is in contact with a region constituting a portion of the lower surface of the wave plate 60. The adhesive may be disposed such that the bonding part 80 is in contact with the entire lower surface of the wave plate 60. The one or more bonding parts 80 bonding the wave plate 60 are formed on the light extracting surface of the package 10. In the light-emitting device 1 shown in the drawings, a single bonding part 80 bonding the wave plate 60 is formed at each of both ends of the wave plate 60 in the longitudinal direction.

The total length of regions in which the bonding parts 80 at both ends in the longitudinal direction of the wave plate 60 are in contact with the wave plate 60 is 10% or greater and 50% or less of the length of the wave plate 60 in the longitudinal direction. This structure allows stable bonding of the wave plate 60 and allows the bonding parts 80 to be formed at regions other than the optical path of the main portion of light to pass through the wave plate 60.

The length of the wave plate 60 in the lateral direction is smaller than the distance between emission points of adjacent light-emitting elements 20 in a top view. The length of the wave plate 60 in the lateral direction is preferably in the range of 1.1 times to twice as large as the length of the minor axis of the FFP on the emission surface of the wave plate 60. With this structure, the wave plate 60 can be mounted on the bonding parts 80 for the lens member described below without being brought into contact with the bonding parts 80. so that the quality of the light-emitting device 1 can be further stable. Bonding parts 80 for bonding the wave plate 60 will be referred to as "first bonding parts 81, and bonding parts 80 for bonding the lens member 70 will be referred to as "second bonding parts 82".

In the minor direction of the FFP on the emission surface of the wave plate 60 in a top view, the length of the wave plate 60 is greater than the length of the light-emitting element 20 corresponding to the wave plate 60 and smaller than the length of the submount 30 bonded to this light-emitting element 20. Further, in the same direction, the length of the wave plate 60 is preferably three times or less as large as the length of the submount 30. This structure allows these components to have sizes suitable for miniaturization of the light-emitting device 1 while the submount 30 has such a shape as to secure the heat dissipation performance for the light-emitting element 20.

In the example of the light-emitting device 1 shown in the drawings, the wave plate 60 is disposed at a position on which the main portion of the first light emitted from the first light-emitting element 21 is incident. The wave plate 60 is disposed at a position on which the main portion of the second light emitted from the second light-emitting element 22 is not incident. The wave plate 60 is disposed at a position on which the main portion of the third light emitted from the third light-emitting element 23 is not incident. The wave plate 60 does not overlap with the portions of the lateral portion 13C along the short sides of the package 10 in a top view. A portion of the wave plate 60 overlaps with a portion of the lateral portion 13C along a long side of the package 10 in a top view.

The lens member 70 is disposed above the light extracting surface of the package 10. The lens member 70 is bonded to the package 10. The lens member 70 is bonded to the cover 12E. A plurality of lights emitted from the light extracting surface of the package 10 are incident on the incidence surface of the lens member 70. The lights incident on the incidence surface of the lens member 70 are emitted from the one or more lens surfaces 70A.

The lens member 70 is disposed such that the one or more lens surfaces 70A overlap with respective light-emitting elements 20 in a top view. The main portions of lights emitted from the different light-emitting elements 20 are emitted from the respective one or more lens surfaces 70A. A single lens surface 70A corresponds to a single light-emitting element 20, and a light from each light-emitting element 20 is emitted through a respective corresponding lens surface 70A.

The lens member 70 is disposed such that the wave plate 60 overlaps with one lens surface 70A in a top view. The lens member 70 can be disposed such that the wave plate 60 does not overlap with two or more lens surfaces 70A in a top view. This structure allows much of light transmitted through the wave plate 60 to be emitted from the lens surface 70A. The lens member 70 can be disposed such that the wave plate 60 does not overlap with the non-lens portion 75B in a top view. This structure allows for reducing the size of the wave plate 60.

The first bonding parts 81 are formed in regions overlapping with the lens portion 75A and the non-lens portion 75B of the lens member 70 in a top view. Each of the first bonding parts 81 that are respectively formed at both ends of the wave plate 60 is formed in a region overlapping with the lens portion 75A and the non-lens portion 75B of the lens member 70 in a top view. Shapes of the wave plate 60 and the lens member 70 satisfying such conditions can contribute to miniaturization of the light-emitting device 1.

The main portion of light that has been transmitted through the wave plate 60 and the main portion of light that has not been transmitted through the wave plate 60 are incident on the incidence surface of the lens member 70. A plurality of lights with different directions of polarization on the light extracting surface of the package 10 are caused to have the same direction of polarization and are incident on the incidence surface of the lens member 70. In the light-emitting device 1 shown in the drawings, the first light and the second light have the same direction of polarization on the incidence surface of the lens member 70. The first light, the second light, and the third light have the same direction of polarization on the incidence surface of the lens member 70.

The first light emitted from the light extracting surface of the package 10 and transmitted through the wave plate 60 and the second light emitted from the light extracting surface of the package 10 are incident on the incidence surface of the lens member 70. t least the main portion of the second light does not pass through the wave plate 60. By allowing light to pass through the wave plate 60 before passing through the lens member 70, a region of the wave plate 60 through which light passes can he reduced, and the size of the wave plate 60 can be reduced, compared with the case in which light that has passed through the lens member passes through the wave plate.

Light emitted to the outside of the light extracting surface of the package 10 is incident on the incidence surface of the lens member 70 and is emitted from the emission surface of the lens member 70. The bonding parts 80 are bonded to the lens member 70 between the light extracting surface of the package 10 and the incidence surface of the lens member 70.

The lens member 70 is secured to the package 10 with the second bonding parts 82 disposed therebetween. The second bonding parts 82 are formed on the upper surface of the package 10, and the lens member 70 is disposed on the second bonding parts 82. The second bonding parts 82 are bonded to the package 10 and the lens member 70. The second bonding parts 82 are bonded to the light extracting surface of the package 10 and the incidence surface of the lens member 70.

The wave plate 60 is disposed between the package 10 and the lens member 70. The wave plate 60 is not in contact with the lens member 70. That is, instead of being mounted on the wave plate 60, the lens member 70 is bonded to the package 10 with the second bonding parts 82 disposed therebetween so that the lens member 70 is not in contact with the wave plate 60. The lens member 70 may be in contact with the wave plate 60, but the light-emitting device 1 is preferably designed such that the lens member 70 is not in contact with the wave plate 60 considering the precision in the manufacturing.

The thickness of the second bonding parts 82 in the upper4ower direction is 200 μm or more and 600 μm or less. The distance between the upper surface of the package 10 and the lower surface of the lens member 70 is 200 μm or more and 600 μm or less. The light extracting surface of the package 10 and the incidence surface of the lens member 70 are flat. The thickness of the second bonding parts 82 is greater than the thickness of the wave plate 60. Securing a gap sufficient to dispose the wave plate 60 by utilizing the thickness of the second bonding parts 82 formed of the adhesive allows for simplifying the shape of the package 10 or the lens member 70. For example, this structure can eliminate the need for forming a projection on the package 10 or a downward projection in the lens member 70 to secure the gap sufficient to dispose the wave plate 60. Such a projection or a downward projection may be formed on the package 10 or the lens member 70.

The distance between the upper surface of the wave plate 60 and the incidence surface of the lens member 70 is 30 μm or greater and 200 μm or less. The lower limit of 30 μm described above is an illustrative value set to avoid contact with the wave plate 60, and the distance may be less than 30 μm. The upper limit of the distance is desirably 200 μm because the greater the distance between the wave plate 60 and the lens member 70, the larger the shape of irradiation of the main portion of light.

The optical axes of the lens surfaces 70A overlap with the optical axes of lights reflected at the reflective members 40 in a top view. The term "overlap" as used herein indicates satisfying at least the condition that the optical axis of a lens surface 70A is in a range of $1/10$ of the shape of the FFP from a point on the optical axis of a light incident on the lens surface 70A.

The distance between the light-emitting element 20 having the maximum length in the long side direction and the inner lateral surface opposite to the light emission side is shorter than the distance between the reflective member 40 corresponding to the light-emitting element 20 and the inner lateral surface on the light emission side, With this arrangement, the optical axis of reflected light can he located at a position sufficiently apart from the lateral portion 13C, and mounting of the lens member 70 on the package 10 can be facilitated.

The second bonding parts 82 are disposed on the peripheral portion of the light extracting surface of the package 10. The second bonding parts 82 are formed at a plurality of locations. The second bonding parts 82 are formed in four corners of the rectangular light extracting surface of the package 10. The second bonding parts 82 are formed in four corners of the rectangular lower surface of the lens member 70. The second bonding parts 82 are not in contact with the first bonding parts 81. Accordingly, the second bonding parts 82 are partially disposed at a plurality of locations as described above instead of being disposed on the entire periphery, and contact with the first bonding parts 81 is avoided, so that the lens member 70 can be stably bonded.

While certain embodiment of the present invention has been described above, the light-emitting device according to the present invention is not strictly limited to the embodiment above. That is, the present invention can be achieved without being limited to the external shape and the structure of the light-emitting device in the embodiment described above. It is also not required that all of the components of the described embodiment be provided. For example, in the case in which part of components of the light-emitting device disclosed in the embodiment is not disclosed in the claims, design flexibility such as substitution, omission, deformation, and changes in materials of the part of components by a person skilled in the art is permitted, and application of the invention described in the claims is specified.

The light-emitting device described in the embodiment described above can be used for a projector, a vehicle headlight, a head-mounted display, lighting, a display, or the like.

What is claimed is:
1. A light-emitting device comprising:
one or more light-emitting elements configured to emit a plurality of lights including a first light and a second light;
a package having an interior surface serving as a disposition surface on which the one or more light-emitting elements are disposed and an upper surface serving as a light extracting surface through which the first light and the second light are to be emitted;
a wave plate bonded to the light extracting surface of the package at a position on which a main portion of the first light emitted from the light extracting surface is to be incident and a main portion of the second light is not to be incident;

a lens member having a lower surface serving as an incidence surface on which the first light emitted from the light extracting surface and transmitted through the wave plate and the second light emitted from the light extracting surface are to be incident; and one or more bonding parts disposed between the upper surface of the package and the lower surface of the lens member to bond the package and the lens member together, wherein the wave plate is disposed between the upper surface of the package and the lower surface of the lens member without being in contact with the lens member.

2. The light-emitting device according to claim 1, wherein the one or more light-emitting elements includes a first light-emitting element configured to emit the first light and a second light-emitting element configured to emit the second light.

3. The light-emitting device according to claim 1, wherein a thickness of each of the one or more bonding parts is greater than a thickness of the wave plate in a thickness direction extending between the package and the lens member.

4. The light-emitting device according to claim 1, wherein the one or more bonding parts are bonded to the light extracting surface of the package and the incidence surface of the lens member.

5. The light-emitting device according to claim 1, wherein the light extracting surface and the incidence surface of the lens member are flat.

6. The light-emitting device according to claim 1, wherein the thickness of each of the one or more bonding parts in thethickness direction extending between the package and the lens member is 200 um or more and 600 um or less.

7. The light-emitting device according to claim 1, wherein the thickness of the wave plate in the thickness direction extending between the package and the lens member is 100 μm or more and 400 μm or less.

8. The light-emitting device according to claim 1, wherein a distance between an upper surface of the wave plate and the incidence surface of the lens member is 30 μm or more and 200 μm or less.

9. The light-emitting device according to claim 1, further comprising
one or more reflective members disposed in an interior space of the package and configured to reflect the first light and the second light emitted from the one or more light-emitting elements,
wherein the first light and the second light reflected at the one or more reflective members are emitted from the light extracting surface.

10. The light-emitting device according to claim 1, wherein
the wave plate is arranged so that the first light and the second light have different directions of polarization on the light extracting surface and have the same direction of polarization on the incidence surface of the lens member.

11. The light-emitting device according to claim 1, further comprising
a third light-emitting element disposed inside the package and configured to emit a third light,
wherein the third light emitted from the light extracting surface is incident on the incidence surface of the lens member, and
the wave plate is disposed at a position on which a main portion of the third light is not incident.

12. The light-emitting device according to claim 2, wherein the one or more bonding parts are bonded to the light extracting surface of the package and the incidence surface of the lens member.

13. The light-emitting device according to claim 2, further comprising
one or more reflective members disposed in the interior space of the package and configured to reflect the first light and the second light emitted from the one or more light-emitting elements,
wherein the first light and the second light reflected at the one or more reflective members are emitted from the light extracting surface.

14. The light-emitting device according to claim 1, wherein in a top view, the wave plate is disposed inside of an external edge of the lens member.

* * * * *